US012681094B2

(12) United States Patent
Baek et al.

(10) Patent No.: US 12,681,094 B2
(45) Date of Patent: Jul. 14, 2026

(54) APPARATUS, SYSTEM, AND METHOD FOR MANAGEMENT OF A BATTERY

(71) Applicants: HYUNDAI MOTOR COMPANY, Seoul (KR); KIA CORPORATION, Seoul (KR)

(72) Inventors: Yo Han Baek, Anyang-si (KR); Yoon Sung Choi, Hwaseong-si (KR); Sang Jin Lee, Goyang-si (KR); Hyo Kyung Lee, Anyang-si (KR); Yoo Hong Jang, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 148 days.

(21) Appl. No.: 18/509,757

(22) Filed: Nov. 15, 2023

(65) Prior Publication Data

US 2025/0044362 A1 Feb. 6, 2025

(30) Foreign Application Priority Data

Aug. 4, 2023 (KR) ........................ 10-2023-0102395

(51) Int. Cl.
*G01R 31/3835* (2019.01)
*G01R 31/392* (2019.01)
(Continued)

(52) U.S. Cl.
CPC ....... *G01R 31/3835* (2019.01); *G01R 31/392* (2019.01); *G01R 31/396* (2019.01); *G07C 5/008* (2013.01); *B60L 58/18* (2019.02)

(58) Field of Classification Search
CPC . G01R 31/3835; G01R 31/392; G01R 31/396
See application file for complete search history.

(56) References Cited

U.S. PATENT DOCUMENTS

| | | | | |
|---|---|---|---|---|
| 7,332,891 B2 * | 2/2008 | Sugimoto | ............. | B60L 3/0046 |
| | | | | 320/116 |
| 2019/0025382 A1 * | 1/2019 | Yamada | ............... | G01R 31/392 |
| | | (Continued) | | |

FOREIGN PATENT DOCUMENTS

| | | | | | |
|---|---|---|---|---|---|
| JP | 2003240806 A | * | 8/2003 | | |
| JP | 2007240299 A | * | 9/2007 | ............. | B60L 58/21 |
| | | | (Continued) | | |

*Primary Examiner* — Walter L Lindsay, Jr.
*Assistant Examiner* — Milton Gonzalez
(74) *Attorney, Agent, or Firm* — MCDONNELL BOEHNEN HULBERT & BERGHOFF LLP

(57) ABSTRACT

A battery management apparatus includes a voltage sensor configured to measure a voltage of one or more battery cells, a control circuit configured to diagnose a defect in the one or more battery cells by determining a voltage change amount of the one or more battery cells using the voltage of the one or more battery cells measured by the voltage sensor, and a storage configured to store data and algorithms driven by the control circuit. The control circuit is configured to obtain a voltage for each battery cell by sequentially measuring the one or more battery cells, and to perform first voltage measurement on the one or more battery cells in a forward chronological order and to perform second voltage measurement on the one or more battery cells in a reverse chronological order.

18 Claims, 13 Drawing Sheets

(51) Int. Cl.
  G01R 31/396       (2019.01)
  G07C 5/00         (2006.01)
  B60L 58/18        (2019.01)

(56)                References Cited

U.S. PATENT DOCUMENTS

| | | |
|---|---|---|
| 2020/0363478 A1 | 11/2020 | Delobel et al. |
| 2021/0086661 A1 | 3/2021 | Furukawa et al. |
| 2021/0247450 A1 | 8/2021 | Ito et al. |
| 2022/0140617 A1 | 5/2022 | Wang et al. |

FOREIGN PATENT DOCUMENTS

| | | |
|---|---|---|
| JP | 2010-085170 A | 4/2010 |
| WO | 2019/043792 A1 | 5/2020 |

* cited by examiner

APPARATUS, SYSTEM, AND METHOD FOR MANAGEMENT OF A BATTERY

CROSS REFERENCE TO RELATED APPLICATIONS

This application claims priority to and the benefit of Korean Patent Application No. 10-2023-0102395, filed in the Korean Intellectual Property Office on Aug. 4, 2023, the entire contents of which are incorporated herein by reference.

BACKGROUND

(a) Field

The present disclosure relates to a battery management apparatus, a system, and a method therefor, and a technique for accurately diagnosing a battery cell failure.

(b) Description of the Related Art

As a battery system such as an energy storage system (ESS) and an electrical vehicle (EV) becomes widely distributed, safety issues are continuing.

If series resistance inside and outside a battery cell is greater than normal, it may cause a battery fire. Accordingly, battery defects are detected before battery use and a battery pack is constructed using only good quality products, but as a battery deteriorates or is subjected to impacts, internal and external series resistance increases.

As the internal and external series resistance of the battery increases, heat generation increases during battery charging and discharging. As heat generation increases, a heat generating area deteriorates and becomes damaged, increasing a risk of fire. Additionally, heat from a heating point is transferred to surroundings, lowering overall performance of the battery cell and accelerating deterioration due to temperature.

In addition, as the series resistance increases, a charging end time due to an upper limit cell voltage advances, making it impossible to fully use charging capacity of normal cells. Furthermore, as the series resistance increases, a discharging end time due to a lower limit cell voltage advances, making it impossible to fully use discharging capacity of normal cells.

A conventional battery cell voltage measurement system uses a sequential measurement method of measuring cell number 1, then measuring cell number 2, and then measuring cell number 3. This sequential voltage measurement system increases a measurement error due to differences in voltage measurement timing while a charging or discharging current is flowing.

Additionally, as a time interval between measurement time points increases, a size of deviation between cell voltage measurements increases. Such a voltage measurement error reduces detection accuracy of a pre-diagnosis function to diagnose an increase in the internal and external series resistance.

SUMMARY

An exemplary embodiment of the present disclosure attempts to provide a battery management apparatus, a system, and a method therefor, capable of diagnosing a battery cell failure by calculating a voltage change amount due to series resistance and diagnosing whether battery series resistance increases based on the voltage change amount.

An exemplary embodiment of the present disclosure attempts to provide a battery management apparatus, a system, and a method therefor, capable of reducing an error due to a difference in voltage measurement time by measuring battery cells by determining an order of voltage measurement for each of the battery cells in forward and reverse directions, and improving battery cell failure diagnosis performance by accurately detecting a voltage change amount of the battery cells.

The technical objects of the present disclosure are not limited to the objects mentioned above, and other technical objects not mentioned may be clearly understood by those skilled in the art from the description of the claims.

An exemplary embodiment of the present disclosure provides a battery management apparatus including a voltage sensor configured to measure a voltage of one or more battery cells, a control circuit configured to diagnose a defect in the one or more battery cells by determining a voltage change amount of the one or more battery cells using the voltage of the one or more battery cells measured by the voltage sensor, and a storage configured to store data and algorithms driven by the control circuit, wherein the control circuit is configured to obtain a voltage for each battery cell by sequentially measuring the one or more battery cells, and to perform first voltage measurement on the one or more battery cells in a forward chronological order and to perform second voltage measurement on the one or more battery cells in a reverse chronological order.

In an exemplary embodiment of the present disclosure, the control circuit may be configured to determine an average value of a first voltage measurement result thereof and a second voltage measurement result thereof as a voltage value of a corresponding battery cell.

In an exemplary embodiment of the present disclosure, the control circuit may be configured to control the voltage sensor to measure an initial voltage of the one or more battery cells at a time of ignition-on of a vehicle, and to obtain an average voltage of the one or more battery cells by determining an average value of the first voltage measurement result and the second voltage measurement result during charging or driving of a vehicle.

In an exemplary embodiment of the present disclosure, the control circuit may be configured to determine the voltage change amount, which is a difference between the initial voltage and the average voltage of the one or more battery cells obtained during charging or driving of the vehicle.

In an exemplary embodiment of the present disclosure, the control circuit may be configured to diagnose that a battery cell with a greatest voltage change amount among voltage change amounts for each of the one or more battery cells is defective.

In an exemplary embodiment of the present disclosure, the control circuit may be configured to repeatedly measure the voltage of each battery cell n times for a predetermined time, and to diagnose a battery cell that has been diagnosed as defective more than m times as a final defect.

In an exemplary embodiment of the present disclosure, the control circuit may be configured to obtain a voltage for each battery cell in response to a case where a SOC (state of charge) of one or more battery cells as a whole is higher than a predetermined standard.

In an exemplary embodiment of the present disclosure, the control circuit may be configured to obtain the voltage for each battery cell in response to a case where a magnitude of current flowing through the one or more battery cells increases by more than a predetermined level during a predetermined time.

In an exemplary embodiment of the present disclosure, the control circuit may be configured to obtain the voltage for each battery cell in response to a case where the magnitude of current flowing through the one or more battery cells is greater than or equal to a predetermined lower limit.

In an exemplary embodiment of the present disclosure, the control circuit may be configured to obtain the voltage for each battery cell in response to a case where a time for which the magnitude of the current flowing through the one or more battery cells remains constant from a lower limit point or a time for which the magnitude of the current flowing through the one or more battery cells remains increased is greater than a predetermined time.

In an exemplary embodiment of the present disclosure, the control circuit may be configured, in response to obtaining the initial voltage of the one or more battery cells at the time of ignition-on, to measure the initial voltage of the one or more battery cells repeatedly n times for a predetermined time, and to store a maximum or minimum voltage among results obtained by measuring the voltage of the one or more battery cells n times.

In an exemplary embodiment of the present disclosure, the control circuit may be configured, in response to a case where a current is discharged while the vehicle is driving, to diagnose battery cell failure by using a difference between the minimum voltage among the average values of each cell obtained by repeating the voltage of the one or more battery cells n times for the predetermined time and the maximum voltage of the initial voltage.

In an exemplary embodiment of the present disclosure, the control circuit may be configured, in response to regenerative braking while the vehicle is driving, to diagnose battery cell failure by using a difference between the maximum voltage among the average values of each cell obtained by repeating the voltage of the one or more battery cells n times for the predetermined time and the maximum voltage of the initial voltage.

In an exemplary embodiment of the present disclosure, the control circuit may be configured, in response to charging the vehicle, to diagnose battery cell failure by using a difference between the maximum voltage among the average values of each cell obtained by repeating the voltage of the one or more battery cells n times for a predetermined time and the minimum voltage of the initial voltage.

In an exemplary embodiment of the present disclosure, the control circuit may be configured to determine standard deviation of the difference between the initial voltage and the average value of each of the one or more battery cells, and to store a number of battery cells satisfying a predetermined condition, the difference between the initial voltage and the average value of each of the one or more battery cells, and date in the storage in response to a case where the standard deviation satisfies a predetermined condition.

An embodiment of the present disclosure provides a system including a battery management apparatus configured to measure a voltage of one or more battery cells and to transmit the measured voltage of the one or more battery cells, and a server configured to diagnose a defect in the one or more battery cells by determining a voltage change amount of the one or more battery cells using the voltage of the one or more battery cell received from the battery management apparatus and to transmit a result thereof to the battery management apparatus, wherein the battery management apparatus is configured to perform first voltage measurement on the one or more battery cells in a forward chronological order and to perform second voltage measurement on the one or more battery cells in a reverse chronological order.

In an exemplary embodiment of the present disclosure, the server may be configured to determine an average value of a first voltage measurement result and a second voltage measurement result as a voltage value of a corresponding battery cell.

In an exemplary embodiment of the present disclosure, the server may be configured to determine a voltage change amount that is a difference between an initial voltage of the one or more battery cells measured at a time of ignition-on of a vehicle and a voltage of the one or more battery cells measured while the vehicle is charging or driving, and to diagnose that a battery cell with a greatest voltage change amount among voltage change amounts for each of the one or more battery cells is defective.

In an exemplary embodiment of the present disclosure, the server may be configured to determine whether a difference between the initial voltage of the one or more battery cells measured at a time the vehicle starts driving and ignition there is turned on and the average value is greater than a predetermined threshold, and to diagnose a battery cell in which the difference between the initial voltage and the average value of each of the one or more battery cells is greater than the predetermined threshold as defective.

An exemplary embodiment of the present disclosure provides a battery management method including performing, by a control circuit, first voltage measurement on one or more battery cells in a forward chronological order, performing, by the control circuit, second voltage measurement on the one or more battery cells in a reverse chronological order, determining, by the control circuit, a voltage change amount of the one or more battery cells using a first voltage measurement result and a second voltage measurement result of each of the one or more battery cells, and diagnosing, by the control circuit, a defect in the one or more battery cells using the voltage change amount of the one or more battery cells.

According to the present technique, it is possible to diagnose a battery cell failure by calculating a voltage change amount due to series resistance and diagnosing whether battery series resistance increases based on the voltage change amount.

According to the present technique, it is possible to reduce an error due to a difference in voltage measurement time by measuring battery cells by determining an order of voltage measurement for each of the battery cells in forward and reverse directions, and to improve battery cell failure diagnosis performance by accurately detecting a voltage change amount of the battery cells.

Furthermore, various effects that can be directly or indirectly identified through this document may be provided.

DETAILED DESCRIPTION

Figure 1:
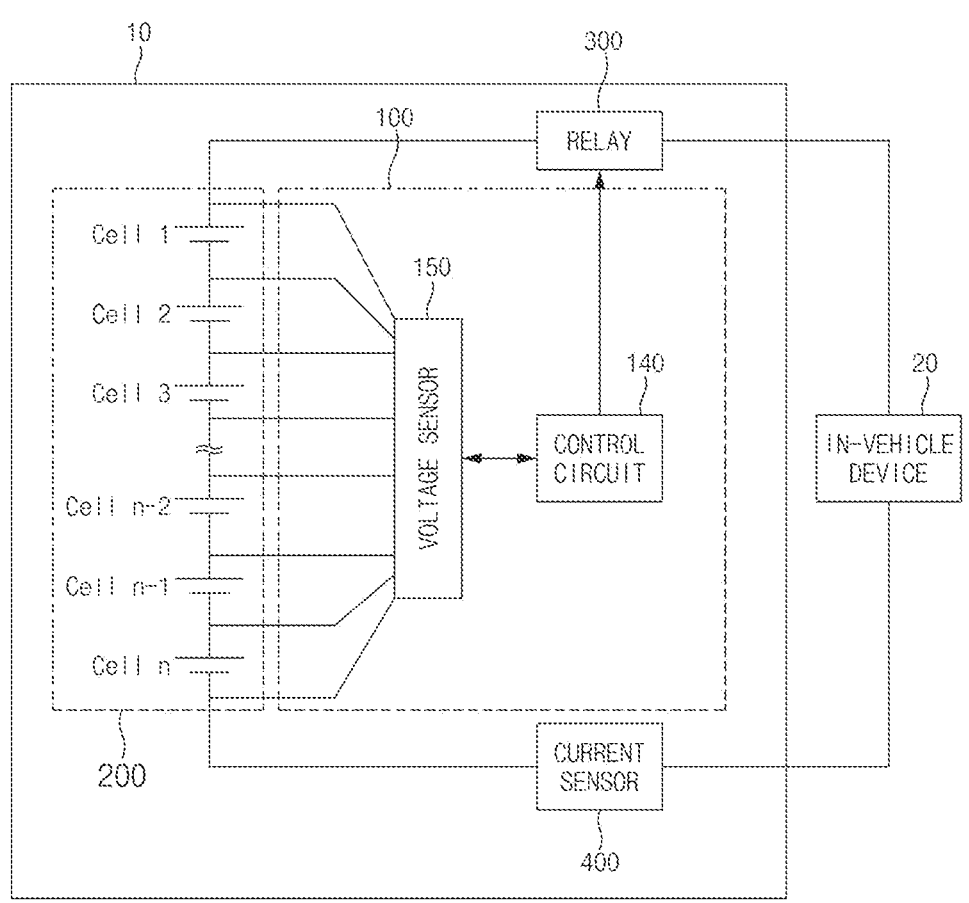
FIG. 1 illustrates a block diagram showing a configuration of a battery system according to a first exemplary embodiment of the present disclosure.

Hereinafter, some exemplary embodiments of the present disclosure will be described in detail with reference to exemplary drawings. It should be noted that in adding reference numerals to constituent elements of each drawing, the same constituent elements have the same reference numerals as possible even though they are indicated on different drawings. In describing an exemplary embodiment, when it is determined that a detailed description of the well-known configuration or function associated with the exemplary embodiment may obscure the gist of the present disclosure, it will be omitted.

In describing constituent elements according to an exemplary embodiment, terms such as first, second, A, B, (a), and (b) may be used. These terms are only for distinguishing the constituent elements from other constituent elements, and the nature, sequences, or orders of the constituent elements are not limited by the terms. Furthermore, all terms used herein including technical scientific terms have the same meanings as those which are generally understood by those skilled in the technical field to which an exemplary embodiment of the present disclosure pertains (those skilled in the art) unless they are differently defined. Terms defined in a generally used dictionary shall be construed to have meanings matching those in the context of a related art, and shall not be construed to have idealized or excessively formal meanings unless they are clearly defined in the present specification.

Hereinafter, various exemplary embodiments of the present disclosure will be described in detail with reference to FIG. 1 to FIG. 12.

FIG. 1 illustrates a block diagram showing a configuration of a battery system according to a first exemplary embodiment of the present disclosure.

The battery system 10 according to the present disclosure may be implemented inside a vehicle or separately. In this case, the battery system 10 may be integrally formed with internal control units of the vehicle, or may be implemented as a separate hardware device to be connected to control units of the vehicle by a connection means. For example, the battery system 10 may be implemented integrally with the vehicle, may be implemented in a form that is installed or attached to the vehicle as a configuration separate from the vehicle, or a part thereof may be implemented integrally with the vehicle, and another part may be implemented in a form that is installed or attached to the vehicle as a configuration separate from the vehicle.

The battery system 10 according to the first embodiment of the present disclosure includes a battery management apparatus 100, a battery pack 200, a relay 300, and a current sensor 400.

The battery management apparatus 100 may determine whether series resistance increases by calculating a voltage change amount of the battery pack 200. To this end, the battery management apparatus 100 may include a control circuit 140 and a voltage sensor 150.

The battery pack 200 includes one or more battery cells Cell1 to Celln connected in series.

The relay 300 may transfer a voltage of the battery pack 200 to an in-vehicle device 20 outside the battery system 10. In this case, the in-vehicle device 20 may include a motor, a controller, etc.

The current sensor 400 may measure a current of the battery pack 200.

Figure 2:
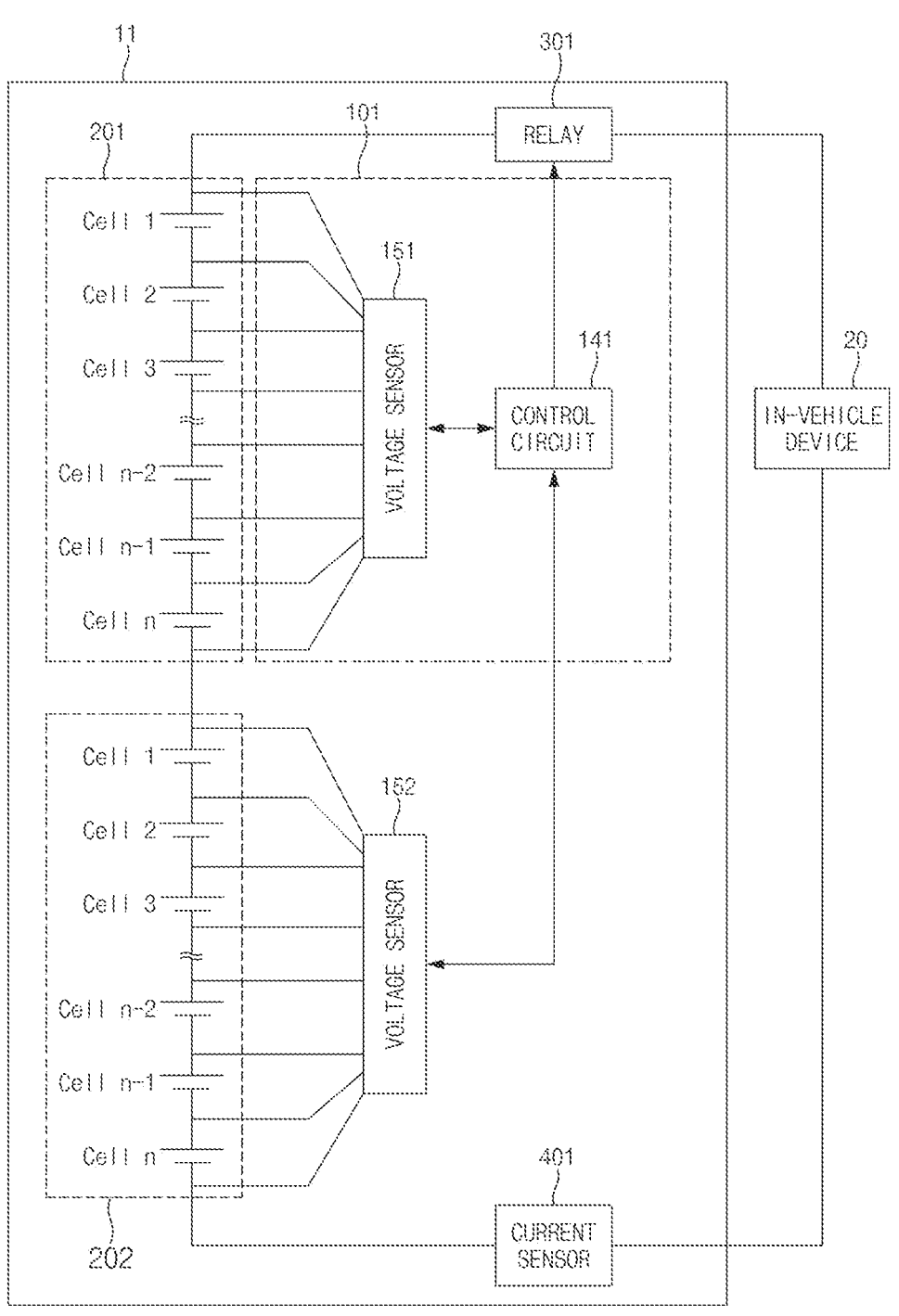
FIG. 2 illustrates a block diagram showing a configuration of a battery system according to a second exemplary embodiment of the present disclosure.

FIG. 2 illustrates a block diagram showing a configuration of a battery system according to a second exemplary embodiment of the present disclosure. FIG. 2 illustrates a structure including a plurality of battery packs 201 and 202 including battery cells and a plurality of voltage sensors 151 and 152.

The battery system 11 according to the second embodiment of the present disclosure includes a battery management apparatus 101 (including a control circuit 141), a battery pack 201, a relay 301, and a current sensor 401.

However, in the second embodiment, at least one battery pack 201 is provided, and the voltage sensors 151 and 152 are provided for each battery pack 201.

Figure 3:
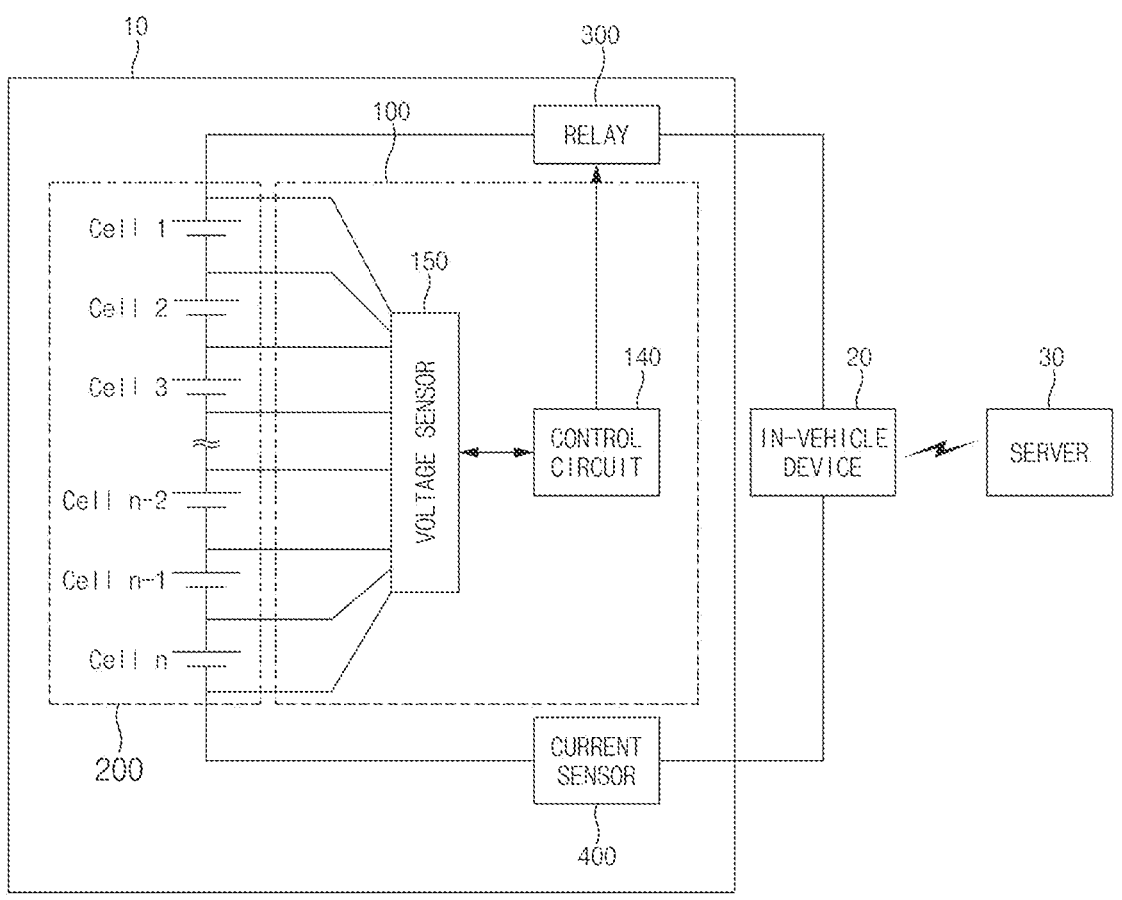
FIG. 3 illustrates a block diagram showing a configuration of a battery system according to a third exemplary embodiment of the present disclosure.

FIG. 3 illustrates a block diagram showing a configuration of a battery system according to a third exemplary embodiment of the present disclosure. The battery system 10 according to the third embodiment of the present disclosure has a same configuration as that of the battery system 10 of FIG. 1.

However, the battery system 10 according to the third embodiment of the present disclosure transmits voltage measurement results of one or more battery cells Cell1 to Celln to the server 30, and the server 30 stores the voltage measurement results of the one or more battery cells Cell1 to Celln. In addition, the server 30 may accumulate the voltage measurement results of each cell for each battery cell, may divide a summed value by a storage time to derive an average voltage, may compare the average voltage and a threshold to determine whether internal resistance increases, and may transmit the results to the battery system 10 of the vehicle. In addition, the server 30 may store the voltage measurement results of the one or more battery cells Cell1 to Celln measured by the voltage sensor 150 received from the battery system 11 of the vehicle, the values obtained by accumulating and summing the voltage measurement results of each cell for each battery cell, the average voltage calculated by dividing the summed value by the storage time, whether or not the internal resistance of each cell increases, determined by comparing the average voltage and the threshold, etc. To this end, the server 30 may include a processor (not illustrated) and a storage (not illustrated).

Figure 4:
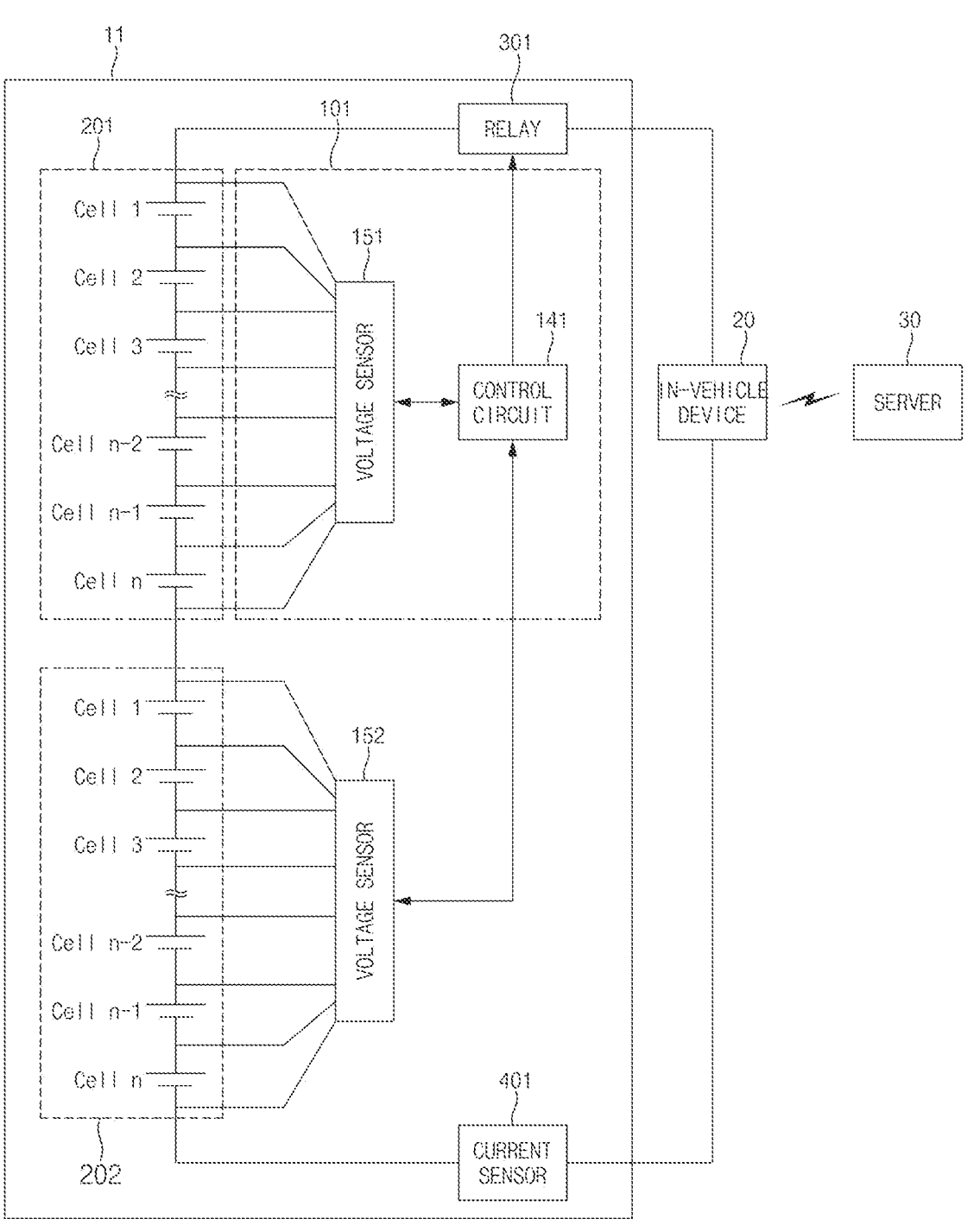
FIG. 4 illustrates a block diagram showing a configuration of a battery system according to a fourth exemplary embodiment of the present disclosure.

FIG. 4 illustrates a block diagram showing a configuration of a battery system according to a fourth exemplary embodiment of the present disclosure. The battery system 11 according to the fourth exemplary embodiment of the present disclosure has a same configuration as that of the battery system 11 according to the second exemplary embodiment of the present disclosure in FIG. 2.

However, the battery system 11 according to the fourth embodiment of the present disclosure transmits voltage measurement results of one or more battery cells Cell1 to Celln to the server 30, and the server 30 stores the voltage measurement results of the one or more battery cells Cell1 to Celln. In addition, the server 30 may accumulate the voltage measurement results of each cell for each battery cell, may divide a summed value by a storage time to derive an average voltage, may compare the average voltage and a threshold to determine whether internal resistance increases, and may transmit the results to the battery system 11 of the vehicle.

Figure 5:
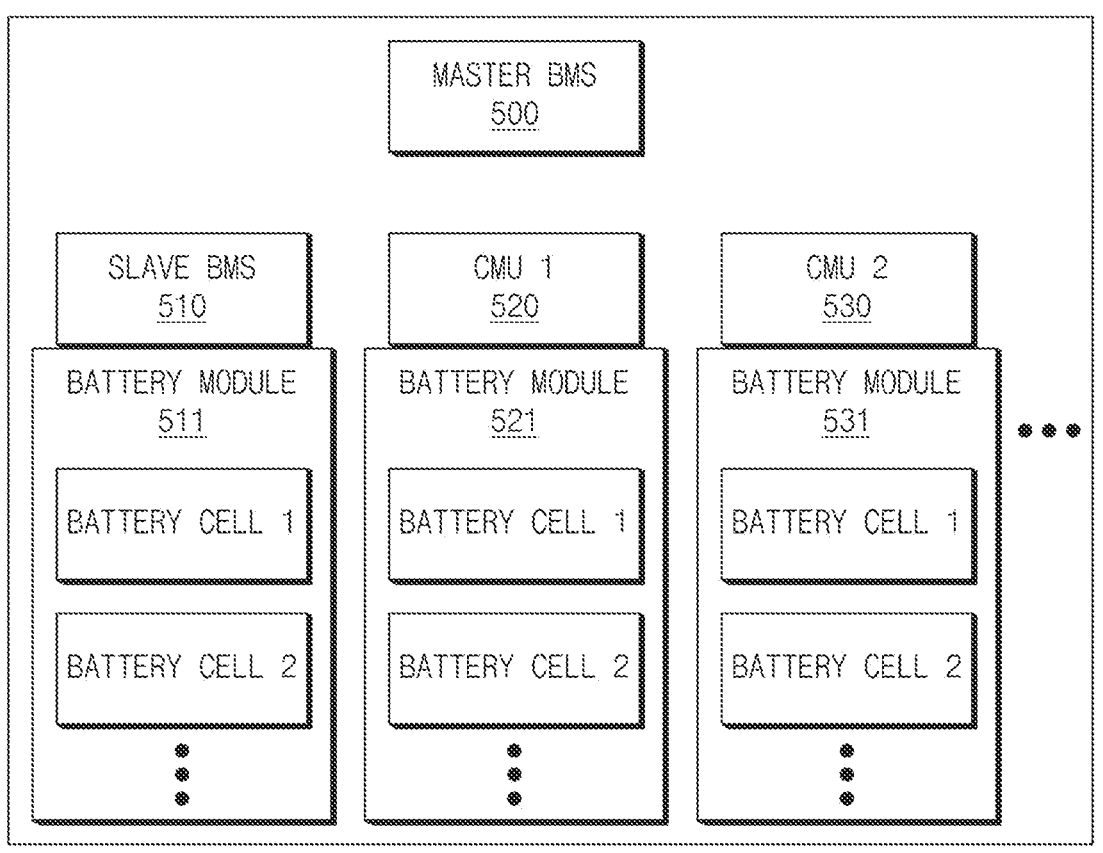
FIG. 5 illustrates a block diagram showing an example configuration of a battery system.

FIG. 5 illustrates a block diagram showing an example configuration of a battery system.

Referring to FIG. 5, the battery system includes a master battery management system (BMS) 500, a slave BMS 510, one or more battery controllers (hereinafter referred to as CMUs 520 and 530), and one or more battery modules 511, 521, and 531.

Each of the one or more battery modules 511, 521, and 531 may include one or more battery cells. The master BMS 500 may obtain information related to the battery module 511 through the slave BMS 510.

The CMU 520 may transfer information (e.g., a measured voltage) of the battery module 521 to the master BMS 500. Additionally, the CMU 530 may transfer information (e.g., measured voltage) of the battery module 531 to the master BMS 500.

Figure 6:
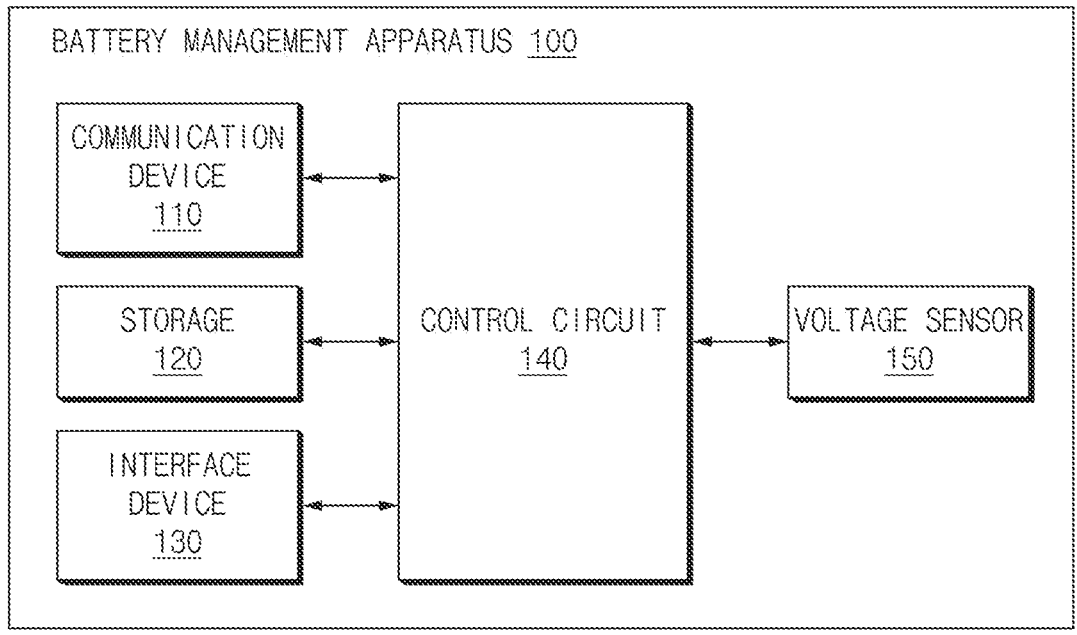
FIG. 6 illustrates a block diagram showing an example configuration of a battery management apparatus.

FIG. 6 illustrates a block diagram showing an example configuration of a battery management apparatus 100.

According to an exemplary embodiment of the present disclosure, the battery management apparatus 100 may be implemented as the master BMS 500 of FIG. 5, and in order to minimize a voltage error as illustrated in FIG. 1 to FIG. 4, may determine whether a defect is caused by series resistance by measuring voltages of battery cells and determining voltage change amounts of the battery cells.

The battery management apparatus 100 may determine a voltage change amount of the one or more battery cells using the voltage of the one or more battery cells measured by the voltage sensor 150, to diagnose a defect in the one or more battery cells. In this case, in order to prevent an error due to timing of voltage measurement of the one or more battery cells, the battery management apparatus 100 may control the voltage sensor 150 to perform first voltage measurement on the one or more battery cells in a forward chronological order (from C1 to C24) and to perform second voltage measurement on the one or more battery cells in a reverse chronological order (C24 to C1), and may determine an average value of a first voltage measurement result and a second voltage measurement result for the one or more battery cells as a voltage value of the corresponding battery cell.

Referring to FIG. 6, the battery management apparatus 100 may include a communication device 110, a storage 120, an interface device 130, a control circuit 140, and a voltage sensor 150. According to an exemplary embodiment of the present disclosure, the battery management apparatus 100 may be implemented as a single unit by coupling components with each other, and some components may be omitted.

The communication device 110 is a hardware device implemented with various electronic circuits to transmit and receive signals through a wireless or wired connection, and may transmit and receive information based on in-vehicle devices and in-vehicle network communication techniques. As an example, the in-vehicle network communication techniques may include at least one of controller area network (CAN) communication, local interconnect network (LIN) communication, flex-ray communication, or a combination thereof.

In addition, the communication device 110 may perform communication with a server 30, infrastructure, third vehicles outside the vehicle, and the like through a mobile communication technique, a wireless Internet communication, or a short range communication technique. Herein, the wireless communication technique may include at least one of wireless LAN (WLAN), wireless broadband (Wibro), Wi-Fi, world Interoperability for microwave access (Wimax), or a combination thereof.

The mobile communication technique refers to technical standards or communication methods for mobile communication, and may include at least one of global system for mobile communication (GSM), code division multi access (CDMA), code division multi access 2000 (CDMA 2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), 4th generation mobile telecommunication (4G), 5th generation mobile telecommunication (5G), or a combination thereof.

The wireless Internet communication refers to a module for wireless Internet access, and may include at least one of wireless LAN (WLAN), wireless-fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), or a combination thereof.

In addition, the short range communication technique may include at least one of Bluetooth, ZigBee, ultra wideband (UWB), radio frequency identification (RFID), infrared data association (IrDA), near field communication (NFC), wireless universal serial bus (Wireless USB), or a combination thereof.

As an example, the communication device 110 may communicate with the in-vehicle device 20, the slave BMS 510, the CMUs 520 and 530, etc. to transmit and receive battery cell voltage measurement results and determined values. In addition, the communication device 110 may communicate with the external server 30, may transmit a voltage value measured for each of one or more battery cells to the server 30, and may receive information related to a defective battery cell among the one or more battery cells from the server 30.

The storage 120 may store data and/or algorithms required for the control circuit 140 to operate, and the like.

As an example, the storage 30 may store the voltage measurement results of the one or more battery cells Cell1 to Celln measured by the voltage sensor 150, the values obtained by accumulating and summing the voltage measurement results of each cell for each battery cell, the average voltage calculated by dividing the summed value by the storage time, whether or not the internal resistance of each cell increases, determined by comparing the average voltage and the threshold, etc.

The storage 120 may include a storage medium of at least one type among memories of types such as a flash memory, a hard disk, a micro, a card (e.g., a secure digital (SD) card or an extreme digital (XD) card), a random access memory (RAM), a static RAM (SRAM), a read-only memory (ROM), a programmable ROM (PROM), an electrically erasable PROM (EEPROM), a magnetic memory (MRAM), a magnetic disk, and an optical disk.

The interface device 130 may include an input means for receiving a control command from a user and an output means for outputting an operation state of the apparatus 100 and results thereof. Herein, the input means may include a key button, and may include a mouse, a joystick, a jog shuttle, a stylus pen, and the like. Furthermore, the input means may include a soft key implemented on the display. As an example, the interface device 130 may display information related to a battery cell diagnosed as having increased internal resistance, and may output a text to notify a user whether a battery pack has failed.

The interface device 130 may be implemented as a head-up display (HUD), a cluster, an audio video navigation (AVN), or a human machine interface (HM), a human machine interface (HMI).

The output device may include a display, and may also include a voice output means such as a speaker. In the instant case, in a response to a case that a touch sensor formed of a touch film, a touch sheet, or a touch pad is provided on the display, the display may operate as a touch screen, and may be implemented in a form in which an input device and an output device are integrated.

In the instant case, the display may include at least one of a liquid crystal display (LCD), a thin film transistor liquid crystal display (TFT LCD), an organic light emitting diode display (OLED display), a flexible display, a field emission display (FED), a 3D display, or any combination thereof.

The control circuit 140 may be electrically connected to the communication device 110, the storage 120, the interface device 130, and the like, may electrically control each component, and may be an electrical circuit that executes software commands, thereby performing various data processing and calculations described below.

The control circuit 140 may process a signal transferred between components of the flight of the battery management apparatus 100 to perform overall control such that each component can perform its function normally. The control circuit 140 may be implemented in the form of hardware, software, or a combination of hardware and software. For example, the control circuit 140 may be implemented as a microprocessor, but the present disclosure is not limited thereto. For example, the control circuit may be, e.g., an electronic control unit (ECU), a micro controller unit (MCU), or other subcontrollers mounted in the vehicle.

The control circuit 140 may sequentially measure one or more battery cells to obtain a voltage for each battery cell, and in this case, perform first voltage measurement on the one or more battery cells in the forward chronological order (from C1 to C24), and may control the voltage sensor 150 to perform second voltage measurement on the one or more battery cells in the reverse chronological order (from C24 to C1).

The control circuit 140 may determine an average value of a first voltage measurement result and a second voltage measurement result for each of the one or more battery cells and determine the results as an average voltage value of the battery cells.

The control circuit 140 may determine a voltage change amount that is a difference between an initial voltage of the one or more battery cells measured at a time of ignition-on of a vehicle and a voltage of the one or more battery cells measured while the vehicle is charging or driving. Additionally, the control circuit 140 may diagnose that a battery cell with a greatest voltage change amount among voltage change amounts for each of the one or more battery cells is defective. In this case, the control circuit 140 may sequentially measure a first voltage of the battery cells in the forward direction at a time of ignition-on of a vehicle, and may determine the result as the initial voltage. In addition, the control circuit 140 may measure the first voltage in the forward direction and the second voltage in the reverse direction in response to measuring voltage during charging or driving of the vehicle, and may determine an average value of the first voltage measurement result and the second voltage measurement result as a voltage value for each cell.

The control circuit 140 may repeatedly measure the voltage of each battery cell n times for a predetermined time, and may diagnose a battery cell that has been diagnosed as defective more than m times as a final defect. For example, voltage measurement may be performed on the battery cells C1 to C24 in a forward direction from C1 to C24 every 2 seconds, and then in a reverse direction from C24 to C1 every 2 seconds, and an average voltage value may be determined for each of the battery cells C1 to C24. A battery cell with a greatest difference value or a battery whose difference value is greater than a predetermined threshold is diagnosed as a cell defect by comparing an initial voltage and an average voltage of battery cells C1 to C24, and in this case, a process is repeated 10 times, and a battery cell that has been diagnosed as defective more than a predetermined threshold out of 10 times may be determined as a final defective cell.

In addition, the control circuit 140 may start battery cell failure diagnosis logic to obtain a voltage for each battery cell in response to a case where a SOC (state of charge) of one or more battery cells as a whole is higher than a predetermined reference value (e.g., 10%).

The control circuit 140 may start the battery cell failure diagnosis logic to obtain the voltage for each battery cell in response to a case where a magnitude of current flowing through one or more battery cells increases by more than a predetermined level during a predetermined time, The control circuit 140 may start the battery cell failure diagnosis logic to obtain the voltage for each battery cell in response to a case where the magnitude of current flowing through one or more battery cells is greater than or equal to a predetermined lower limit (e.g., 0.5 C).

The control circuit 140 may start the battery cell failure diagnosis logic to obtain the voltage for each battery cell in response to a case where a time for which the magnitude of the current flowing through one or more battery cells remains constant from a lower limit point or a time for which the magnitude of the current flowing through one or more battery cells remains increased is greater than a predetermined time.

The control circuit 140 may measure an initial voltage of one or more battery cells at a time of ignition-on of a vehicle, and may measure a voltage of one or more battery cells while charging or driving the vehicle. In this case, in response to measuring the voltage of one or more battery cells while charging or driving the vehicle, the control circuit 140 performs the first voltage measurement in the forward order and second voltage measurement in the reverse order, and uses an average value of first and second voltage measurement results as an average voltage for each battery cell.

The control circuit 140 may determine a voltage change amount, which is a difference between the initial voltage and the average voltage for each battery cell obtained while charging or driving the vehicle.

Accordingly, the control circuit 140 may determine that a battery cell with a greatest voltage change amount among voltage change amounts for each of the one or more battery cells is defective. For example, a battery cell C5 may be determined to be defective in response to a case where the battery cell C5 has a highest voltage change rate among the battery cells C1 to C24.

As another example, the control circuit 140 may determine whether the difference between the initial voltage and the average value of one or more battery cells is greater than or equal to a predetermined threshold, and may diagnose battery cells in which the difference between the initial voltage and the average value of each of the one or more battery cells is greater than the predetermined threshold as defective.

In response to a case where the vehicle starts driving, the control circuit 140 may obtain the initial voltage of the one or more battery cells at the time of ignition on.

In response to obtaining the initial voltage of the one or more battery cells at the time of ignition on, the control circuit 140 may measure the initial voltage of the one or more battery cells repeatedly n times for a predetermined time, and may store a maximum or minimum voltage among results obtained by measuring it n times.

In response to a case where a current is discharged while the vehicle is driving, the control circuit 140 may diagnose battery cell failure by using a difference between the minimum voltage among the average values of each cell obtained by repeating it n times for a predetermined time and the maximum voltage of the initial voltage. As such, determining the difference using the maximum voltage of the initial voltage and the minimum voltage among the average values of each battery cell is to facilitate diagnosis of defective cells by maximizing the difference.

In response to regenerative braking while the vehicle is driving, the control circuit 140 may diagnose battery cell failure by using a difference between the maximum voltage among the average values of each cell obtained by repeating it n times for the predetermined time and the maximum voltage of the initial voltage.

During charging of the vehicle, the control circuit 140 may diagnose battery cell failure by using a difference between the maximum voltage among the average values of each cell obtained by repeating it n times for the predetermined time and the minimum voltage of the initial voltage.

The control circuit 140 may determine standard deviation of the difference between the initial voltage and the average value of each of the one or more battery cells, and in response to a case where the standard deviation satisfies a predetermined condition, may store the number of battery cells satisfying a predetermined condition, the difference between the initial voltage and the average value of each of the one or more battery cells, and the date in the storage 120.

The voltage sensor 150 may measure the voltage of the one or more battery cells to transfer a result thereof to the control circuit 140.

In FIG. 3 and FIG. 4, functions of the above-described control circuit 140, 141 may be mounted on the server 30, to perform the above-described functions in the server 30, such as diagnosing battery cell failure using the voltage change amount for each battery cell and correcting errors at the time of voltage measurement.

Figure 7A:
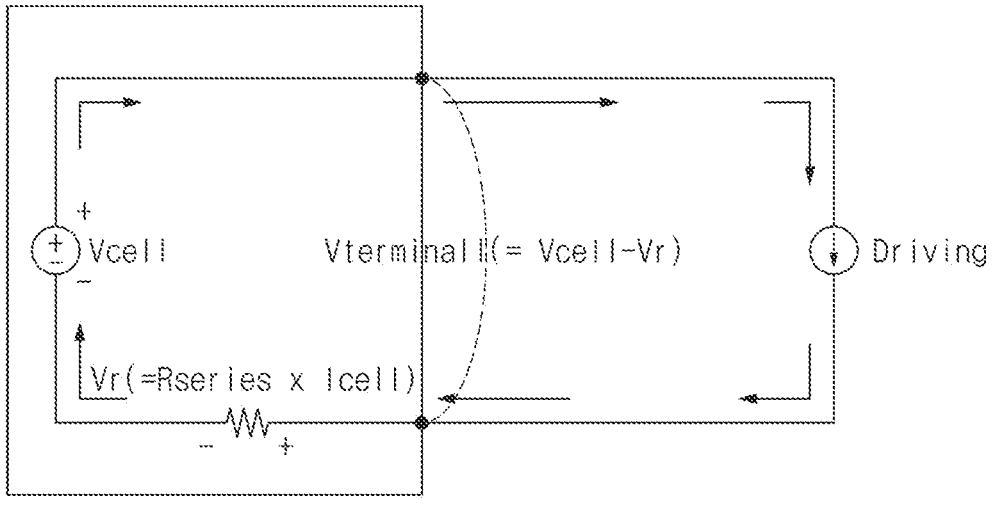
FIG. 7A illustrates an example voltage change amount in a driving state.
Figure 7B:
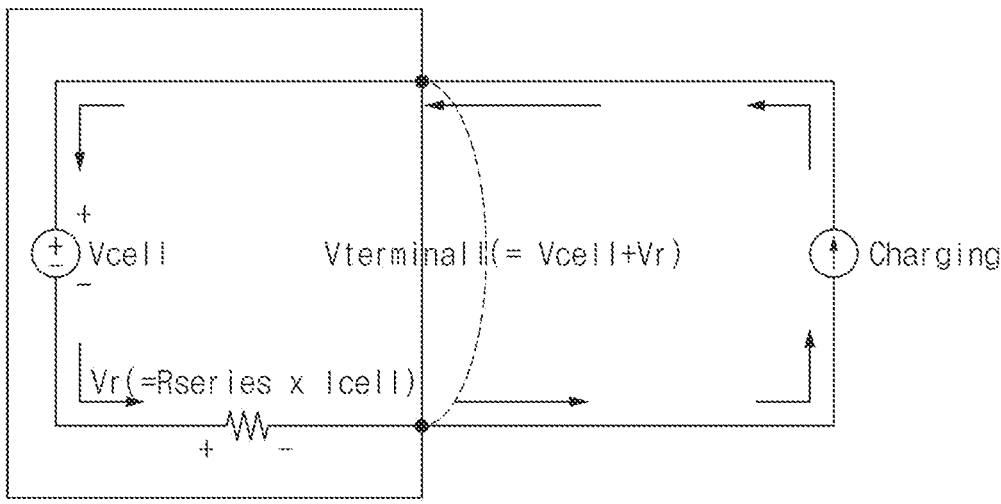
FIG. 7B illustrates an example voltage change amount in a charging state.

FIG. 7A illustrates an example voltage change amount in a driving (discharging) state, and FIG. 7B illustrates an example voltage change amount in a charging state.

Referring to FIG. 7A, a voltage across the battery cell may decrease in proportion to a current depending on magnitude of series resistance during driving.

In response to a case where an entry condition of battery cell failure diagnosis logic is satisfied during driving after ignition of the vehicle is turned on, the battery management apparatus 100 measures the voltage of each battery cell, corrects errors due to voltage measurement time difference, and determines a voltage decrease amount. Next, the battery management apparatus 100 may compare the voltage decrease amount for each battery cell to diagnose a battery cell with a greatest voltage decrease amount as defective.

Referring to FIG. 7B, a voltage across the battery cell may increase in proportion to a current depending on magnitude of series resistance during charging.

In response to a case where an entry condition of battery cell failure diagnosis logic is satisfied during regenerative braking after ignition of the vehicle is turned on, the battery management apparatus 100 measures the voltage of each battery cell, corrects errors due to voltage measurement time difference, and determines a voltage increase amount. Next, the battery management apparatus 100 may compare the voltage increase amount for each battery cell to diagnose a battery cell with a greatest voltage increase amount as defective.

In addition, in response to a case where an entry condition of battery cell failure diagnosis logic is satisfied during charging of the vehicle, the battery management apparatus 100 measures the voltage of each battery cell, corrects errors due to voltage measurement time difference, and determines the voltage increase amount. Next, the battery management apparatus 100 may compare the voltage increase amount for each battery cell to diagnose a battery cell with a greatest voltage increase amount as defective.

Figure 8:
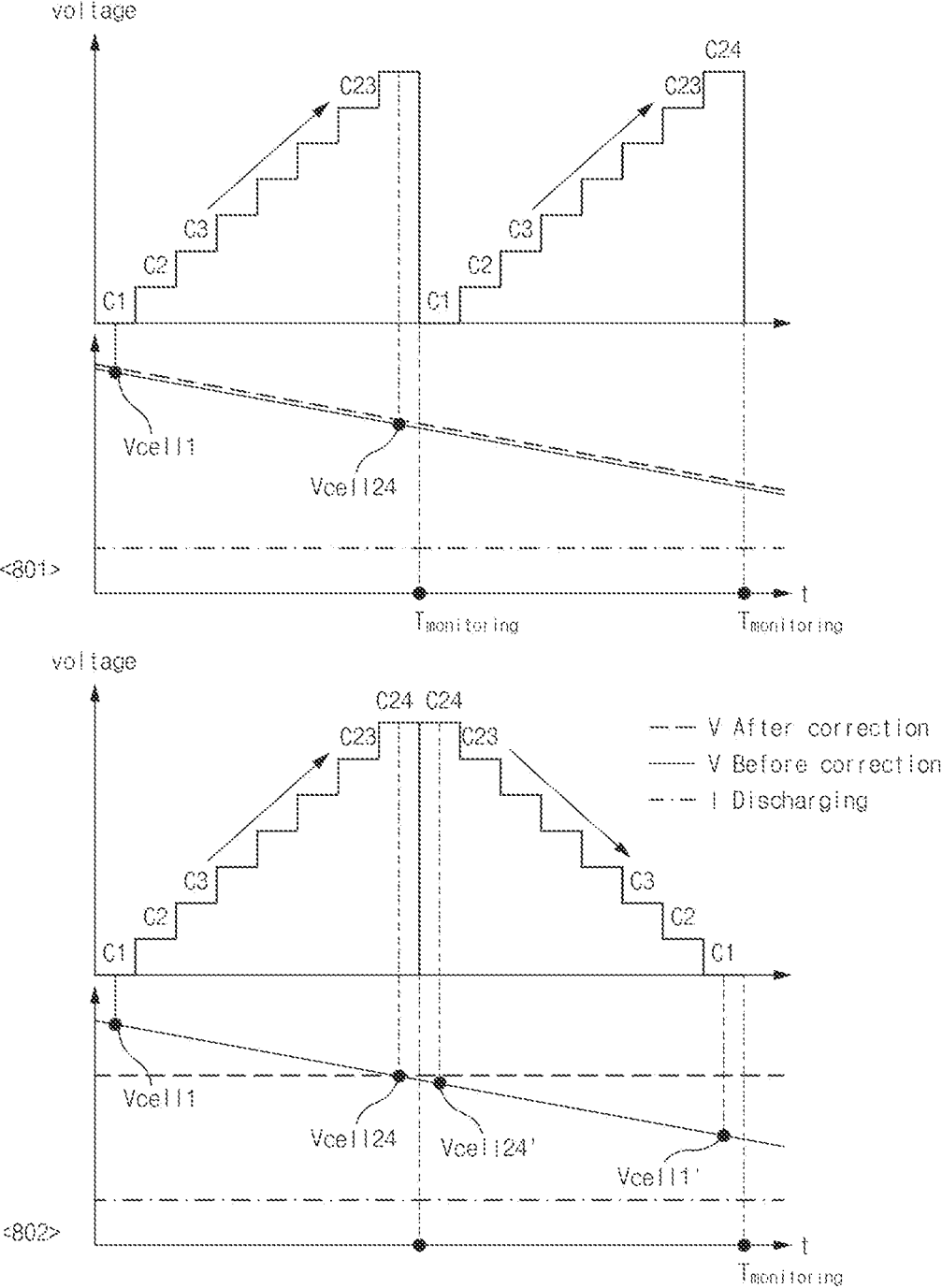
FIG. 8 illustrates a view for describing a voltage sensing method of a battery system according to the first exemplary embodiment of the present disclosure.

FIG. 8 illustrates a view for describing a voltage sensing method of a battery system according to the first exemplary embodiment of the present disclosure.

Referring to FIG. 8, the battery management apparatus 100 measures voltages of the battery cells C1, C2, . . . , and C24 a predetermined number of times (e.g., 10 times) every predetermined time (e.g., 5 seconds) while a discharge current is flowing.

In this case, as shown in a graph 801, during first measurement, the voltages are sequentially measured from the battery cells C1 to C24, and during second measurement, the voltage are sequentially measured from the battery cells C1 to C24. In all 10 measurements, the voltages are sequentially measured from the battery cells C1 to C24. As such, in response to measuring the voltages of the battery cells C1, C2, . . . , and C24 sequentially each time, as the number of battery cells C1, C2, . . . , and C24 increases, a discharge amount accumulates and the voltages are measured lower.

That is, as shown in the graph 801, in response to a case where the voltages of all the battery cells are measured sequentially rather than simultaneously, a cell whose measurement time is later (e.g., C24) has a greater current discharge, so the voltages are lowered and then measured, and thus the measured voltage of the battery cell C24 is lower than that of the battery cell C1. In response to detecting a battery pack defect condition using voltage measurement data measured under this phenomenon, battery cells that are delayed in a measurement order are monitored as if their voltages are lower, which reduces battery pack defect detection performance.

Accordingly, as shown in a graph 802, the battery management apparatus 100 sequentially measures the voltages in the forward direction from the battery cells C1 to C24 during first measurement, and sequentially measures the voltages in the reverse direction from the battery cells C24 to C1 during second measurement. The battery management apparatus 100 sequentially measures the voltages in the forward direction from the battery cells C1 to C24 during third measurement like the first measurement, and sequentially measures the voltages in the reverse direction from the battery cells C24 to C1 during fourth measurement.

$$Vcell1 = \frac{V1 + V1\prime}{2} - Vcell24 = \frac{V24 + V24\prime}{2} \qquad \text{Equation 1}$$

Vcell1 indicates an average voltage of the battery cell C1, V1 indicates the measured voltage of the battery cell C1 during the first measurement, and V1' indicates the measured voltage of the battery cell C1 during the second measurement.

Vcell24 indicates an average voltage of the battery cell C24, V24 indicates the measured voltage of the battery cell C24 during the first measurement, and V24' indicates the measured voltage of the battery cell C24 during the second measurement.

As such, the battery management apparatus 100 measures the voltages of the battery cells in the forward or reverse direction, and then determines an average value for each cell voltage at each monitoring time, which can be used to diagnose a battery pack defect.

Accordingly, as shown in the graph 802, it can be seen that the voltage before correction is shown as a straight line with the voltage decreasing over time, and after determining the average value and correcting it, the voltage remains constant over time.

Figure 9:
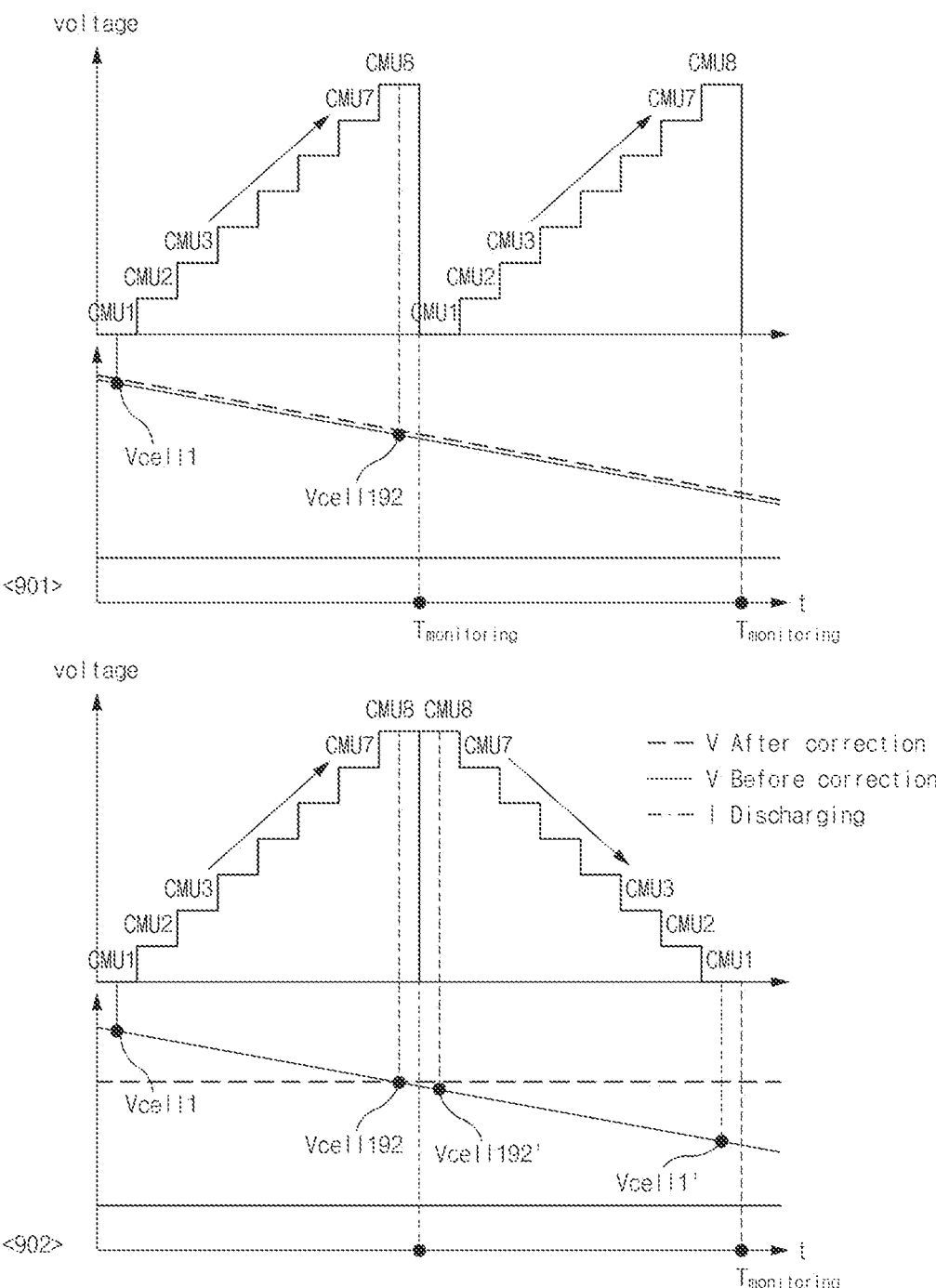
FIG. 9 illustrates a view for describing a voltage sensing method of a battery system according to the second exemplary embodiment of the present disclosure.

FIG. 9 illustrates a view for describing a voltage sensing method of a battery system according to the second exemplary embodiment of the present disclosure.

Referring to FIG. 9, an example of measuring the voltage for each CMU is shown, each CMU includes 24 battery cells, and an example is provided from CMU1 to CMU8.

That is, FIG. 9 shows an example where at least one CMU including at least one battery cell is provided, as in FIG. 2 and FIG. 4. As shown in FIG. 5, the CMU is a controller connected to a battery module including at least one battery cell.

Referring to FIG. 9, the battery management apparatus 100 measures a voltage of each battery module including at least one battery cell a predetermined number of times (e.g., 10 times) every predetermined time (e.g., 5 seconds) while a discharge current is flowing. However, in FIG. 9, for convenience, it is indicated as CMU, which is a controller connected to the battery module, and voltages of a CMU1, a CMU2, and a CMU8 are measured respectively. For example, the CMU1 includes battery cells C1 to C24, the CMU2 includes battery cells C25 to C49, and the CMU8 includes battery cells C192.

In this case, as shown in a graph 901, during first measurement, the voltages are sequentially measured from the battery modules CMU1 to CMU8, and during second measurement, the voltage are sequentially measured from the battery cells C1 to C24. In all 10 measurements, the voltages are sequentially measured from the battery cells C1 to C24. As such, in response to measuring the voltages of the battery modules CMU1 to CMU8 sequentially each time, as the number of battery modules CMU1 to CMU8 increases, a discharge amount accumulates and the voltages are measured lower.

That is, as in the graph 901, in response to a case where the voltages of all the battery modules CMU1 to CMU8 are measured sequentially rather than simultaneously, a battery module whose measurement time is later (e.g., CMU8) has a greater current discharge, so the voltages are lowered and then measured, and thus the measured voltage of the battery cell CMU8 is lower than that of the battery module CMU1. In response to detecting a battery pack defect condition using voltage measurement data measured under this phenomenon, battery packs that are delayed in a measurement order are monitored as if their voltages are lower, which reduces battery pack defect detection performance.

Accordingly, as shown in a graph 902, the battery management apparatus 100 sequentially measures the voltages in the forward direction from the battery modules CMU1 to CMU8 during first measurement, and sequentially measures the voltages in the reverse direction from the battery modules CMU8 to CMU1 during second measurement. During third measurement, the voltages are sequentially measured from the battery modules CMU1 to CMU8 in the forward direction as in the first measurement, and during fourth measurement, the voltages are sequentially measured from the battery modules CMU8 to CMU1 in the reverse direction. In this case, the battery management apparatus 100 may measure a voltage of battery cells included in each battery module, and may determine an average voltage as shown in Equation 2 below.

$$Vcell1 = \frac{V1 + V1\prime}{2} - Vcell192 = \frac{V192 + V192\prime}{2} \qquad \text{Equation 2}$$

Vcell1 indicates an average voltage of the battery cell C1, V1 indicates the measured voltage of the battery cell C1 during the first measurement, and V1' indicates the measured voltage of the battery cell C1 during the second measurement.

Vcell192 indicates an average voltage of the battery cell C192, V192 indicates the measured voltage of the battery cell C192 during the first measurement, and V192' indicates the measured voltage of the battery cell C192 during the second measurement.

As such, the battery management apparatus 100 measures the voltages of the battery cells in the forward or reverse direction, and then determines an average value for each cell voltage at each monitoring time, which can be used to diagnose a battery pack defect.

Accordingly, as shown in the graph 902, it can be seen that the voltage before correction is shown as a straight line with the voltage decreasing over time, and after determining the average value and correcting it, the voltage remains constant over time.

FIG. 8 illustrates a case where logic for minimizing a voltage error of the present disclosure is applied to a vehicle equipped with the battery cells C1 to C24, and FIG. 9 illustrates a case where the logic for minimizing a voltage error of the present disclosure is applied to a vehicle equipped with the battery modules CMU1 to CMU8.

Figure 10:
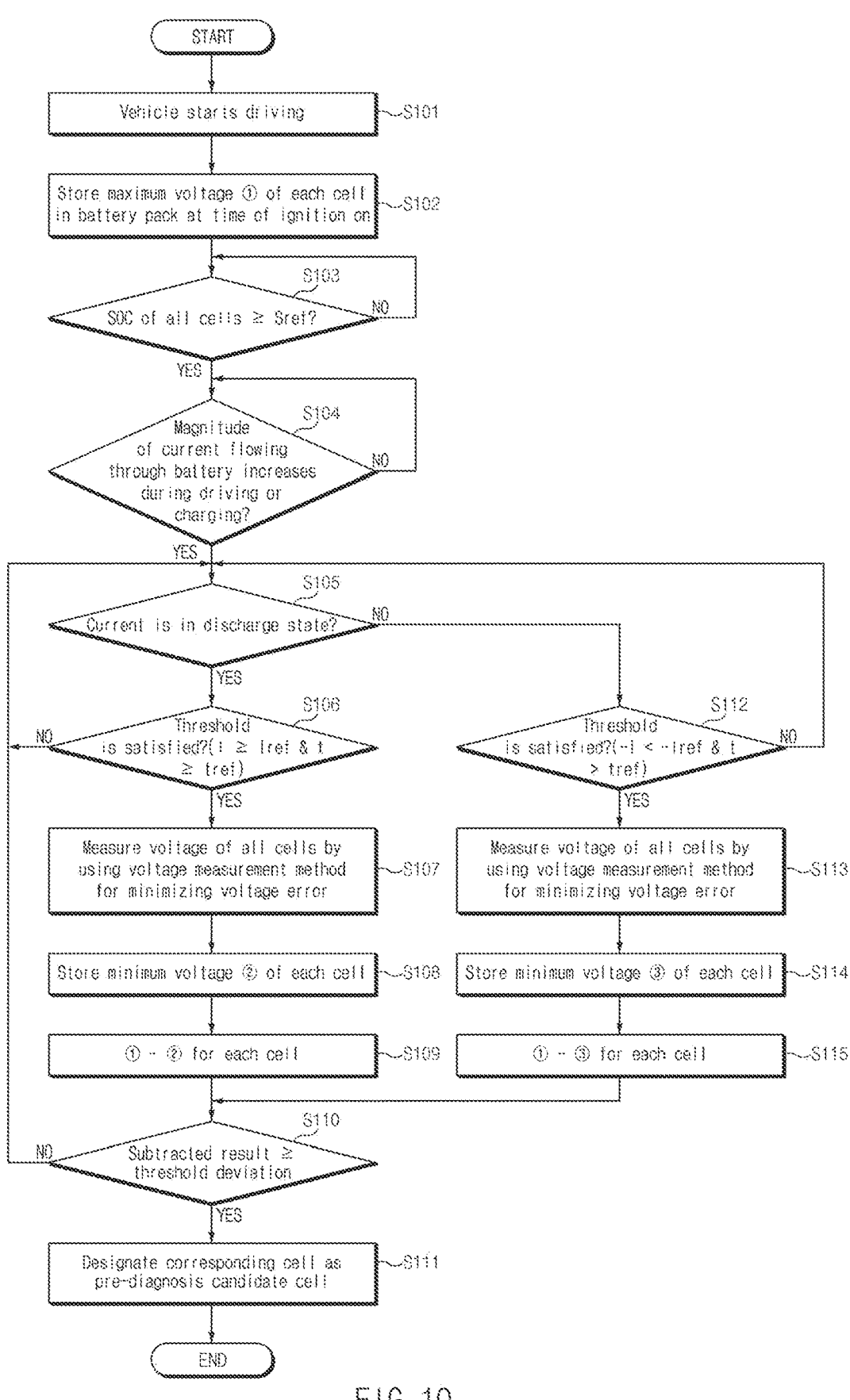
FIG. 10 illustrates an example flowchart for describing a battery failure diagnosis method while a vehicle with a battery management apparatus is driving.
Figure 11:
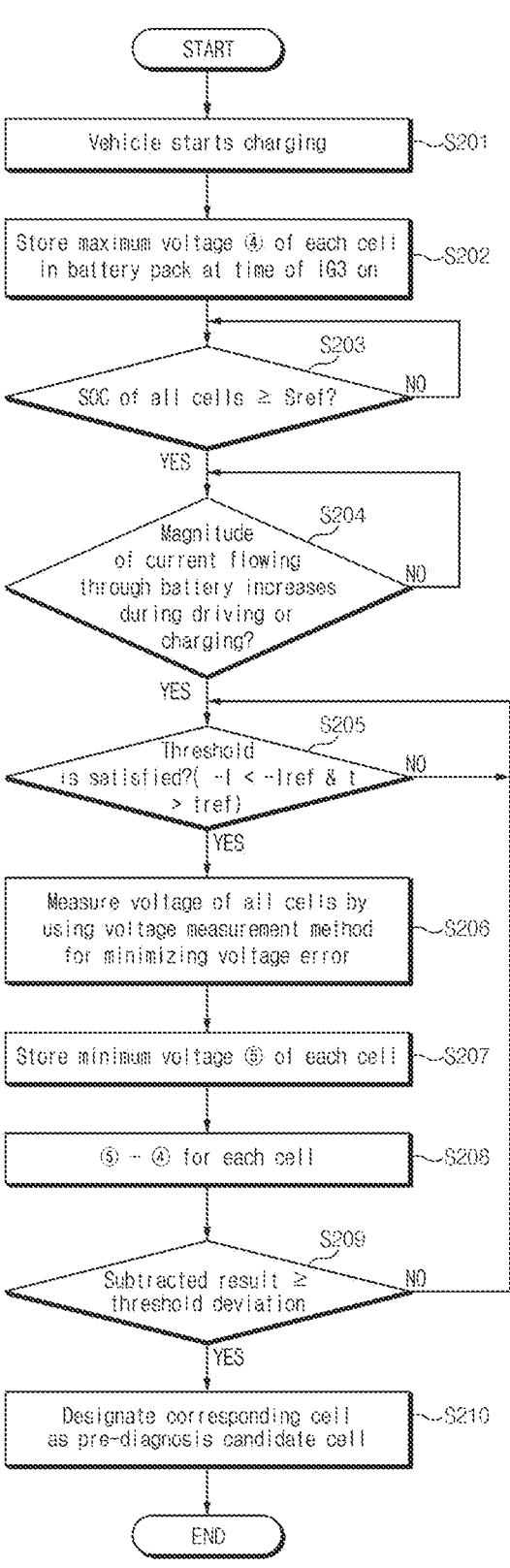
FIG. 11 illustrates an example flowchart for describing a battery failure diagnosis method while a vehicle with a battery management apparatus is charged.

Hereinafter, a battery failure diagnosis method according to an exemplary embodiment of the present disclosure will be described with reference to FIG. 10 and FIG. 11. FIG. 10 illustrates an example flowchart for describing a battery failure diagnosis method while a vehicle with a battery management apparatus is driving, and FIG. 11 illustrates an example flowchart for describing a battery failure diagnosis method while a vehicle with a battery management apparatus is charged.

Hereinafter, it is assumed that the battery management apparatus 100 of FIG. 1 performs the processes of FIG. 10 and FIG. 11. In addition, in the description of FIG. 10 and FIG. 11, operations described as being performed by a device may be understood as being controlled by the control circuit 140 of the battery management apparatus 100. In following exemplary embodiments, operations S101 to S210 may be performed sequentially, but are not necessarily performed sequentially. For example, an order of each operation may be changed, and at least two operations may be performed in parallel.

Referring to FIG. 10, after a vehicle starts driving at S101, the battery management apparatus 100 stores a maximum voltage ① of each battery cell in a battery pack at a time of ignition on (IG ON) at S102. For example, in response to measuring the voltage of the battery cell C1 10 times every 2 seconds, a maximum voltage may be saved as the voltage of the battery cell C1 among the 10 voltage measurement results.

Next, the battery management apparatus 100 determines whether the state of charge (SOC) of all the cells is greater than a reference value (Sref) at S103, and determines whether a magnitude of current flowing through a battery increases during driving or charging at S104. In this case, the battery management apparatus 100 may perform battery pack failure diagnosis logic when the SOC of all the cells is not too low (e.g., 10% or more). Additionally, the battery management apparatus 100 may determine that a current flowing through the battery is in an increased state in response to a case where it increases by more than a predetermined magnitude for a predetermined time.

In response to a case where the SOC of all the cells is greater than or equal to the reference value Sref and the magnitude of current flowing through the battery increases during driving or charging, the battery management apparatus 100 determines whether the current is in a discharge state at S105. The battery management apparatus 100 determines whether current magnitude and time conditions in a state where the vehicle is in a current discharge state satisfy threshold values at S106.

That is, the battery management apparatus 100 continues the battery pack failure diagnosis logic in response to a case where a magnitude of the increasing current is greater than or equal to a lower limit (e.g., 0.5 C) and a time for which the current magnitude remains constant or increases from the lower limit is greater than a threshold tref.

In response to a case where the current magnitude and time conditions in the state where the vehicle is in the current discharge state satisfy the thresholds, in order to minimize the voltage error, the battery management apparatus 100 measures the voltage of all the cells by changing the measurement order as shown in FIG. 8 and FIG. 9 described above at S107. In this case, the battery management apparatus 100 may determine an average voltage by cumulatively summing the voltage of each battery cell for each cell and dividing the sum by a storage time.

The battery management apparatus 100 stores a minimum voltage ② among the measured voltages of all the cells at S108. For example, in response to a case where the voltage of battery cell C1 is measured 10 times every 2 seconds, the average voltage of 10 times may be determined, and the minimum voltage among the 10 average voltages may be stored.

The battery management apparatus 100 subtracts the minimum voltage ② stored in step S108 from the maximum voltage ① stored in step S102 at S108. In this case, using the maximum voltage among the initial voltages and the minimum voltage among the voltages measured while driving or charging the vehicle is to maximize the voltage difference to make diagnosis clear and easy.

$$\Delta V_{CellNo} = \Delta V_{igon\_CellNo} - \Delta V_{Driving\_CellNo} \qquad \text{Equation 3}$$

That is, the battery management apparatus 100 determines a voltage difference ($\Delta V_{CellNo}$) between a cell voltage ($V_{igon\_CellNo}$) stored at the time of ignition on and an average voltage ($V_{Driving\_CellNo}$) measured during driving (discharging operation) as shown in Equation 3, and determines a standard deviation for $\Delta V_{CellNo}$ of all the cells.

Subsequently, the battery management apparatus 100 may determine whether a result subtracted in step S109 is greater than or equal to a predetermined threshold deviation at S110, and may designate a corresponding cell as a pre-diagnosis candidate cell in response to a case where the subtracted result is greater than the predetermined threshold deviation at S111.

For example, the battery management apparatus 100 determines stores numbers and voltages ($\Delta V_{CellNo}$) of cells for which the standard deviation of all the cells is greater than 99.7% or less than 0.3% along with the date. The battery management apparatus 100 measures and stores the voltage of the battery cell 10 times at a predetermined time, determines whether a difference between the minimum voltage and the maximum voltage is greater than the threshold deviation as shown in Equation 3 above each time to store the number and the voltage of the battery cell with the date, and may designate the cell as a pre-diagnosis candidate cell in response to a case where the number of times it exceeds the threshold deviation, which is the difference between the minimum voltage and the maximum voltage, is greater than a predetermined number of times, based on accumulated data.

Thereafter, in response to a case where a pre-diagnosis candidate cell is designated as the pre-diagnosis candidate cell more than a predetermined number of times, the battery management apparatus 100 may determine that the battery cell is defective and requires detailed diagnosis, and may display a defective battery cell state on the interface device 130 so that a user can check it.

Meanwhile, in response to cases other than current discharge, i.e., regenerative braking, in step S105, the battery management apparatus 100 determines whether current magnitude and time conditions in a state where the vehicle is in a current discharge state satisfy threshold values at S112.

That is, the battery management apparatus 100 continues the battery pack failure diagnosis logic in response to a case where a magnitude of the increasing current is greater than or equal to a lower limit (e.g., 0.5 C) and a time for which the current magnitude remains constant or increases from the lower limit is greater than a threshold tref.

In response to a case where the current magnitude and time conditions in the state where the vehicle is in the current discharge state satisfy the thresholds, in order to minimize the voltage error, the battery management apparatus 100 measures the voltage of all the cells by changing the measurement order as shown in FIG. 8 and FIG. 9 described above at S113. In this case, the battery management apparatus 100 may determine an average voltage by cumulatively summing the voltage of each battery cell for each cell and dividing the sum by a storage time.

The battery management apparatus 100 stores a maximum voltage ③ among the measured voltages of all the cells at S114. For example, in response to a case where the voltage of battery cell C1 is measured 10 times every 2 seconds, the average voltage of 10 times may be determined, and the minimum voltage among the 10 average voltages may be stored.

The battery management apparatus 100 subtracts the maximum voltage ③ stored in step S114 from the maximum voltage ① stored in step S102 at S115.

Subsequently, the battery management apparatus 100 may determine whether a result subtracted in step S115 is greater than or equal to a predetermined threshold deviation at S110, and may designate a corresponding cell as a pre-diagnosis candidate cell in response to a case where the subtracted result is greater than the predetermined threshold deviation at S111.

In the third exemplary embodiment of the present disclosure shown in FIG. 3, the above steps S102 to S111 may be implemented in the server 30 outside the vehicle. That is, the server 30 may receive a voltage value of each cell in the battery pack measured from the battery system 10 of the vehicle, and may determine the average value of the voltage of each battery cell and determine whether to designate the cell as the pre-diagnosis candidate cell according to a difference between the average value of the voltage of each battery cell and the voltage of the battery cell measured at the time of ignition on.

Referring to FIG. 11, after the vehicle starts charging at S201, the battery management apparatus 100 may store a minimum voltage ④ of each cell in the battery pack at a time of ignition on (IG3 ON) at S202. Next, the battery management apparatus 100 determines whether the state of charge (SOC) of all the cells is greater than a reference value (Sref) at S203, and determines whether a magnitude of current flowing through a battery increases during driving or charging at S204. In this case, the battery management apparatus 100 may perform battery pack failure diagnosis logic when the SOC of all the cells is not too low (e.g., 10% or more). Additionally, the battery management apparatus 100 may determine that a current flowing through the battery is in an increased state in response to a case where it increases by more than a predetermined magnitude for a predetermined time.

In response to a case where the SOC of all the cells is greater than or equal to the reference value Sref and the magnitude of current flowing through the battery increases during driving or charging, the battery management apparatus 100 determines whether the current magnitude and time conditions in the state where the vehicle is in the current discharge state satisfy the threshold values at S205.

That is, the battery management apparatus 100 continues the battery pack failure diagnosis logic in response to a case where a magnitude of the increasing current is greater than or equal to a lower limit (e.g., 0.5 C) and a time for which the current magnitude remains constant or increases from the lower limit is greater than a threshold tref.

In response to a case where the current magnitude and time conditions in the state where the vehicle is in the current discharge state satisfy the thresholds, in order to minimize the voltage error, the battery management apparatus 100 measures the voltage of all the cells by changing the measurement order as shown in FIG. 8 and FIG. 9 described above at S206. In this case, the battery management apparatus 100 may determine an average voltage by cumulatively summing the voltage of each battery cell for each cell and dividing the sum by a storage time.

The battery management apparatus 100 stores a maximum voltage ⑤ among the measured voltages of all the cells at S207. For example, in response to a case where the voltage of battery cell C1 is measured 10 times every 2 seconds, the average voltage of 10 times may be determined, and the minimum voltage among the 10 average voltages may be stored.

The battery management apparatus 100 subtracts the maximum voltage ④ stored in step S202 from the minimum voltage ⑤ stored in step S108 at S208.

Subsequently, the battery management apparatus 100 may determine whether a result subtracted in step S208 is greater than or equal to a predetermined threshold deviation at S209, and may designate a corresponding cell as a pre-diagnosis candidate cell in response to a case where the subtracted result is greater than the predetermined threshold deviation at S210.

As such, according to the present disclosure, errors due to differences in voltage measurement timing for each battery cell may be minimized, ultimately improving accuracy of diagnosing defective battery cells by first measuring the voltages sequentially in the forward direction and then second measuring the voltages sequentially in the reverse direction, and determining an average value of the first and second measurement results for each cell as the measured voltage value of the corresponding cell, in response to measuring the voltage of one or more battery cells.

In addition, according to the present disclosure, it is possible to accurately diagnose battery cell defects by determining a voltage change amount for each battery cell and determining whether internal and external series resistance increases according to magnitude of the voltage change amount for each battery cell.

Figure 12:
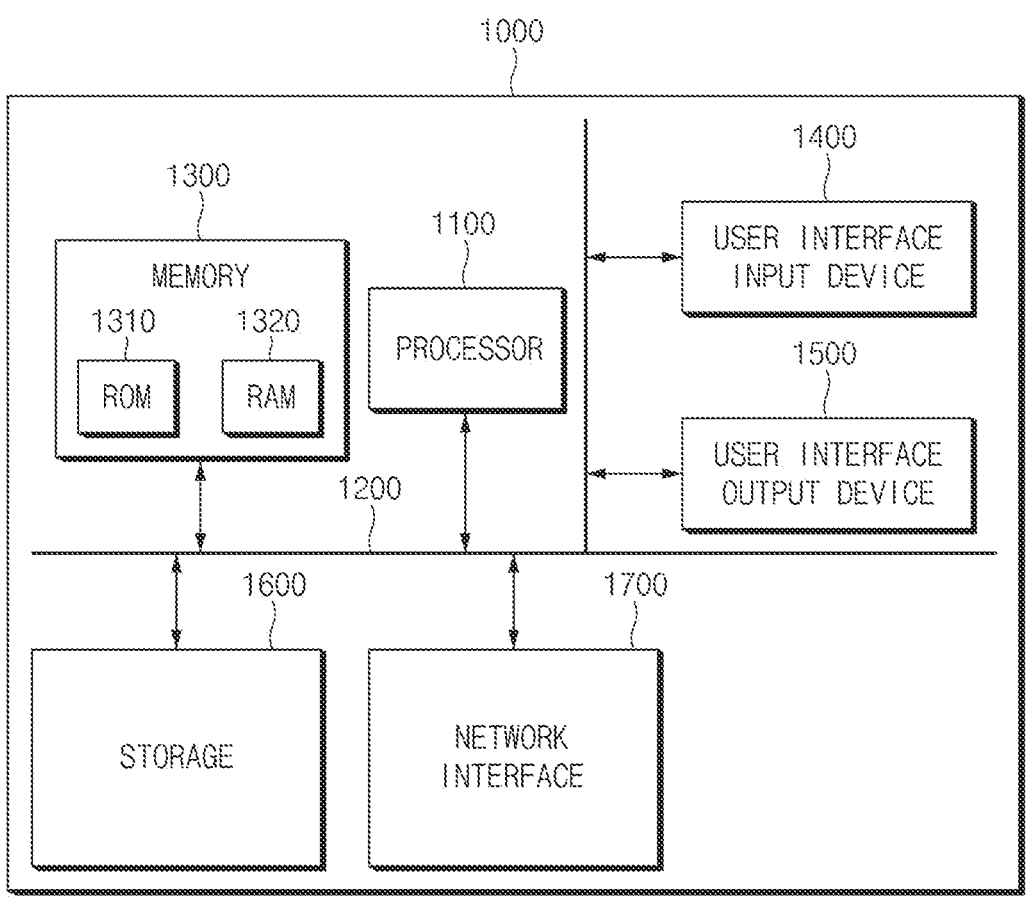
FIG. 12 illustrates an example computing system.

FIG. 12 illustrates an example computing system.

Referring to FIG. 12, the computing system 1000 includes at least one processor 1100 connected through a bus 1200, a memory 1300, a user interface input device 1400, a user interface output device 1500, and a storage 1600, and a network interface 1700.

The processor 1100 may be a central processing unit (CPU) or a semiconductor device that performs processing on commands stored in the memory 1300 and/or the storage 1600. The memory 1300 and the storage 1600 may include various types of volatile or nonvolatile storage media. For example, the memory 1300 may include a read only memory (ROM) 1310 and a random access memory (RAM) 1320.

Accordingly, steps of a method or algorithm described in connection with the exemplary embodiments disclosed herein may be directly implemented by hardware, a software module, or a combination of the two, executed by the processor 1100. The software module may reside in a storage medium (i.e., the memory 1300 and/or the storage 1600) such as a RAM memory, a flash memory, a ROM memory, an EPROM memory, an EEPROM memory, a register, a hard disk, a removable disk, and a CD-ROM.

An exemplary storage medium is coupled to the processor 1100, which can read information from and write information to the storage medium. Alternatively, the storage medium may be integrated with the processor 1100. The processor and the storage medium may reside within an application specific integrated circuit (ASIC). The ASIC may reside within a user terminal. Alternatively, the processor and the storage medium may reside as separate components within the user terminal.

The above description is merely illustrative of the technical idea of the present disclosure, and those skilled in the art to which the present disclosure pertains may make various modifications and variations without departing from the essential characteristics of the present disclosure.

Therefore, the exemplary embodiments disclosed in the present disclosure are not intended to limit the technical ideas of the present disclosure, but to explain them, and the scope of the technical ideas of the present disclosure is not limited by these exemplary embodiments. The protection range of the present disclosure should be interpreted by the claims below, and all technical ideas within the equivalent range should be interpreted as being included in the scope of the present disclosure.

The invention claimed is:

1. A battery management apparatus comprising:
a voltage sensor configured to measure a voltage of one or more battery cells;
a control circuit configured to diagnose a defect in the one or more battery cells by determining a voltage change amount of the one or more battery cells using the voltage of the one or more battery cells measured by the voltage sensor; and
a storage configured to store data and algorithms driven by the control circuit;
wherein the control circuit is configured to:
obtain a voltage for each battery cell by sequentially measuring the one or more battery cells in response to a case where a SOC (state of charge) of one or more battery cells as a whole is higher than a predetermined standard and a magnitude of current flowing through the one or more battery cells increases by more than a predetermined level during a predetermined time; and
control the voltage sensor to perform a first voltage measurement on the one or more battery cells in a forward chronological order, and to perform a second voltage measurement on the one or more battery cells in a reverse chronological order.

2. The battery management apparatus of claim 1, wherein the control circuit is further configured to determine an average value of the first voltage measurement result and the second voltage measurement result as a voltage value of a corresponding battery cell.

3. The battery management apparatus of claim 1, wherein the control circuit is further configured to control the voltage sensor to measure an initial voltage of the one or more battery cells at a time of ignition-on of a vehicle, and to obtain an average voltage of the one or more battery cells by determining an average value of the first voltage measurement result and the second voltage measurement result during charging or driving of a vehicle.

4. The battery management apparatus of claim 3, wherein the control circuit is further configured to determine a voltage change amount, which is a difference between the initial voltage and the average voltage of the one or more battery cells obtained during charging or driving of the vehicle.

5. The battery management apparatus of claim 4, wherein the control circuit is further configured to determine that a battery cell having a greatest voltage change amount among voltage change amounts for each of the one or more battery cells is defective.

6. The battery management apparatus of claim 5, wherein the control circuit is further configured to repeatedly measure the voltage of each battery cell n times for a predetermined time, and to determine that a battery cell that has been diagnosed as defective more than m times is a final defect.

7. The battery management apparatus of claim 3, wherein the control circuit is further configured to, in response to obtaining the initial voltage of the one or more battery cells at the time of ignition-on, measure the initial voltage of the one or more battery cells repeatedly n times for a predetermined time, and store a maximum or minimum voltage among results obtained by measuring the voltage of the one or more battery cells n times.

8. The battery management apparatus of claim 7, wherein the control circuit is further configured to, in response to a case where a current is discharged while the vehicle is driving, diagnose a battery cell failure by using a difference between the minimum voltage among the average values of each cell obtained by repeating the measuring of the voltage of the one or more battery cells n times for the predetermined time and the maximum voltage of the initial voltage.

9. The battery management apparatus of claim 7, wherein the control circuit is further configured to, in response to regenerative braking while the vehicle is driving, diagnose a battery cell failure by using a difference between the maximum voltage among the average values of each cell obtained by repeating the measuring of the voltage of the one or more battery cells n times for the predetermined time and the maximum voltage of the initial voltage.

10. The battery management apparatus of claim 7, wherein the control circuit is further configured to, in response to charging the vehicle, diagnose a battery cell failure by using a difference between the maximum voltage among the average values of each cell obtained by repeating the measuring of the voltage of the one or more battery cells n times for a predetermined time and the minimum voltage of the initial voltage.

11. The battery management apparatus of claim 3, wherein the control circuit is further configured to determine standard deviation of the difference between the initial voltage and the average value of each of the one or more battery cells, and to store a number of battery cells satisfying a predetermined condition, the difference between the initial voltage and the average value of each of the one or more battery cells, and date in the storage in response to a case where the standard deviation satisfies a predetermined condition.

12. The battery management apparatus of claim 1, wherein the control circuit is further configured to obtain the voltage for each battery cell in response to a case where the magnitude of current flowing through the one or more battery cells is greater than or equal to a predetermined lower limit.

13. The battery management apparatus of claim 12, wherein the control circuit is further configured to obtain the voltage for each battery cell in response to a case where a time for which the magnitude of the current flowing through the one or more battery cells remains constant from a lower limit point or a time for which the magnitude of the current flowing through the one or more battery cells remains increased is greater than a predetermined time.

14. A system comprising:
a battery management apparatus configured to measure a voltage of one or more battery cells in response to a case where a SOC (state of charge) of one or more battery cells as a whole is higher than a predetermined standard and a magnitude of current flowing through the one or more battery cells increases by more than a predetermined level during a predetermined time, and to transmit the measured voltage of the one or more battery cells; and a server configured to diagnose a defect in the one or more battery cells by determining a voltage change amount of the one or more battery cells using the voltage of the one or more battery cell received from the battery management apparatus, and to transmit a result of the voltage change to the battery management apparatus; wherein the battery management apparatus is further configured to perform a first voltage measurement on the one or more battery cells in a forward chronological order, and to perform a second voltage measurement on the one or more battery cells in a reverse chronological order.

15. The system of claim 14, wherein the server is further configured to determine an average value of a first voltage measurement result and a second voltage measurement result as a voltage value of a corresponding battery cell.

16. The system of claim 15, wherein the server is further configured to determine whether a difference between the initial voltage of the one or more battery cells measured at a time the vehicle starts driving and ignition there is turned on and the average value is greater than a predetermined threshold, and to determine a battery cell in which the difference between the initial voltage and the average value of each of the one or more battery cells is greater than the predetermined threshold is defective.

17. The system of claim 14, wherein the server is further configured to determine a voltage change amount that is a difference between an initial voltage of the one or more battery cells measured at a time of ignition-on of a vehicle and a voltage of the one or more battery cells measured while the vehicle is charging or driving, and to determine that a battery cell with a greatest voltage change amount among voltage change amounts for each of the one or more battery cells is defective.

18. A battery management method comprising:

obtaining, by a control circuit, a voltage for each battery cell in response to a case where a SOC (state of charge) of one or more battery cells as a whole is higher than a predetermined standard and a magnitude of current flowing through the one or more battery cells increases by more than a predetermined level during a predetermined time;

performing, by the control circuit, a first voltage measurement on one or more battery cells in a forward chronological order;

performing, by the control circuit, a second voltage measurement on the one or more battery cells in a reverse chronological order;

determining, by the control circuit, a voltage change amount of the one or more battery cells using a first voltage measurement result and a second voltage measurement result of each of the one or more battery cells; and diagnosing, by the control circuit, a defect in the one or more battery cells using the voltage change amount of the one or more battery cells.

* * * * *